United States Patent
Nanayakkara et al.

(10) Patent No.: US 12,529,135 B2
(45) Date of Patent: Jan. 20, 2026

(54) METHODS OF MODIFYING OPENINGS IN HARDMASKS AND PHOTORESISTS TO ACHIEVE DESIRED CRITICAL DIMENSIONS

(71) Applicant: Applied Materials, Inc., Santa Clara, CA (US)

(72) Inventors: Charith Nanayakkara, Gloucester, MA (US); John Hautala, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 134 days.

(21) Appl. No.: 18/243,042

(22) Filed: Sep. 6, 2023

(65) Prior Publication Data

US 2025/0075315 A1    Mar. 6, 2025

(51) Int. Cl.
C23C 16/04    (2006.01)
C23C 16/26    (2006.01)

(52) U.S. Cl.
CPC ............ *C23C 16/047* (2013.01); *C23C 16/26* (2013.01)

(58) Field of Classification Search
None
See application file for complete search history.

(56) References Cited

U.S. PATENT DOCUMENTS

2006/0043536 A1* 3/2006 Co .................... H01L 21/32139
                                                         257/632
2019/0348281 A1* 11/2019 Xu ...................... H01L 21/0337
2022/0406592 A1    12/2022 Wu

FOREIGN PATENT DOCUMENTS

KR    1020060116490 A    11/2006
KR    1020110002781 A    1/2011
KR    1020110116474 A    10/2011

OTHER PUBLICATIONS

International Search Report and Written Opinion for International Application No. PCT/US2024/041257, mailed on Nov. 20, 2024, 10 pages.

* cited by examiner

*Primary Examiner* — Michael P. Rodriguez
(74) *Attorney, Agent, or Firm* — KDW Firm PLLC

(57) ABSTRACT

A method of modifying an opening in a mask to achieve desired critical dimensions, the method including performing a pre-implant on the mask to implant the mask with a dopant material, wherein a material of the mask is densified and the opening is enlarged, directing a first radical beam at a first lateral side of the opening to deposit a layer of material on the first lateral side, and directing a second radical beam at a second lateral side of the opening opposite the first lateral side to deposit a layer of material on the second lateral side.

18 Claims, 8 Drawing Sheets

(A-A from Fig. 1A)

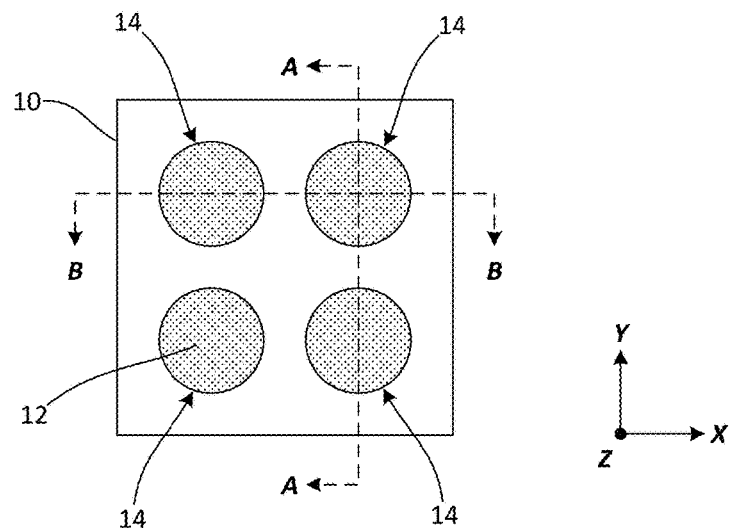
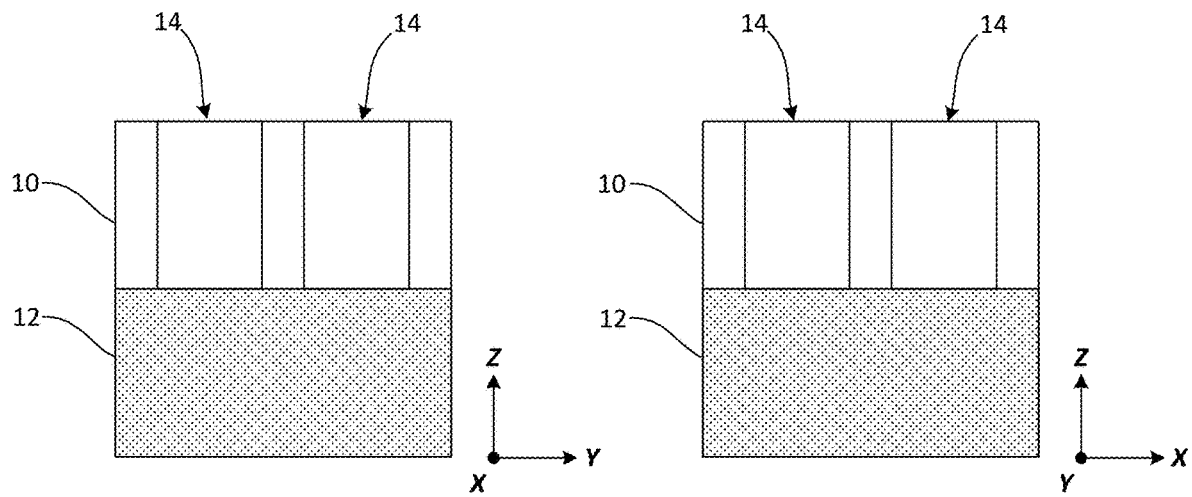
Fig. 1A
Fig. 1B
(A-A from Fig. 1A)
Fig. 1C
(B-B from Fig. 1A)

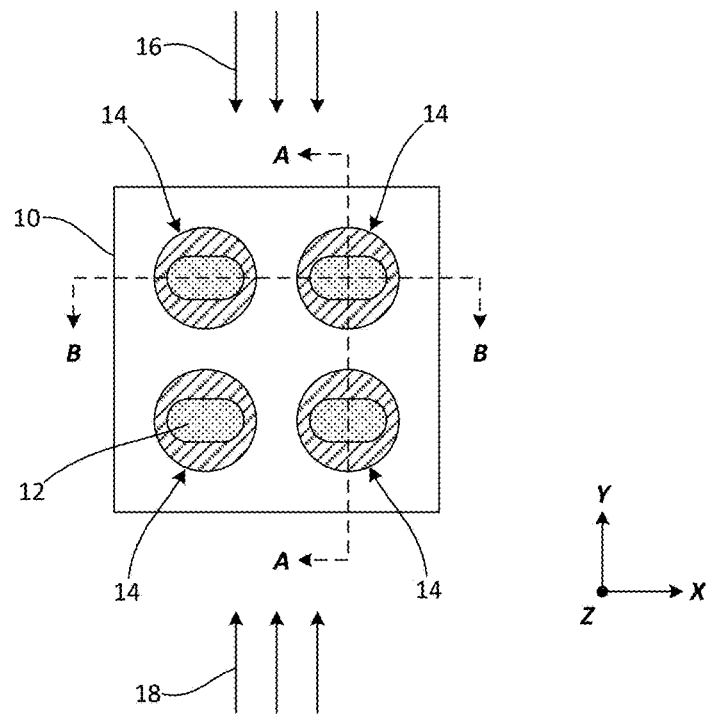
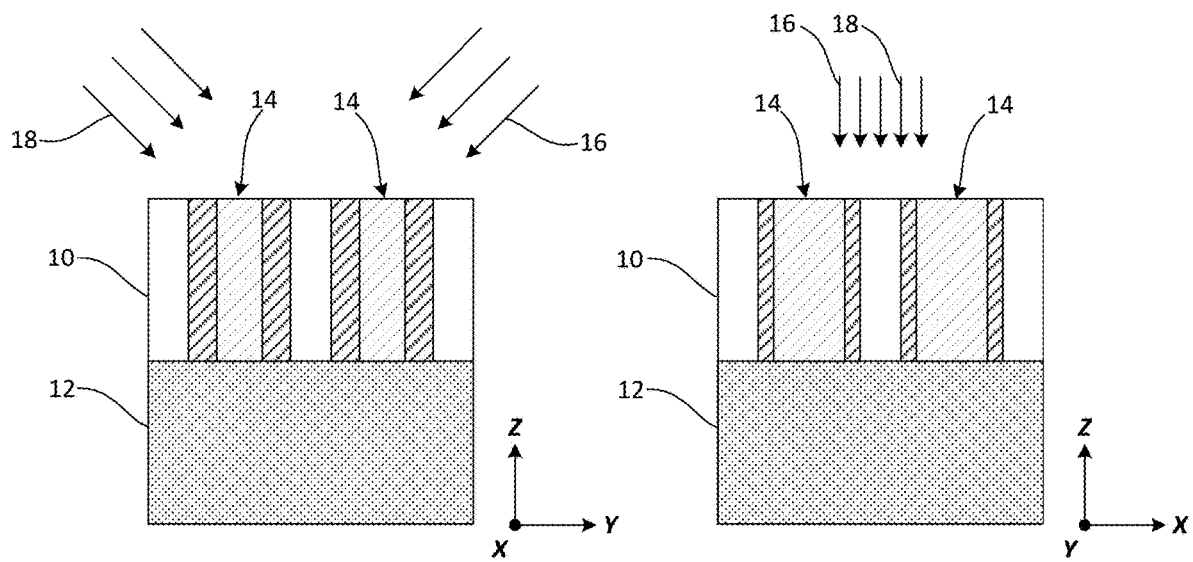
*Fig. 2A*
*Fig. 2B*
*(A-A from Fig. 2A)*
*Fig. 2C*
*(B-B from Fig. 2A)*

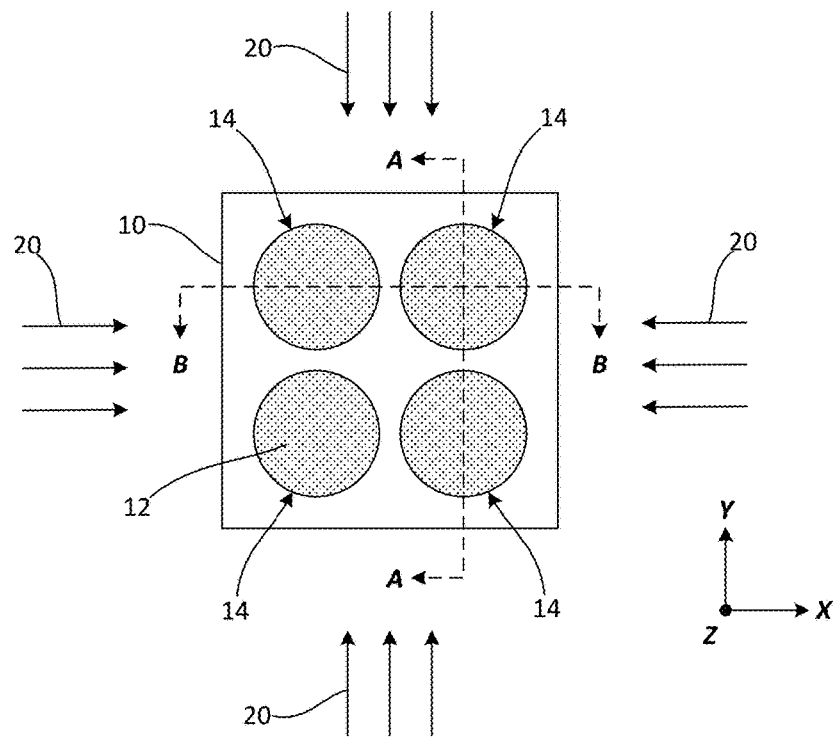
Fig. 3A
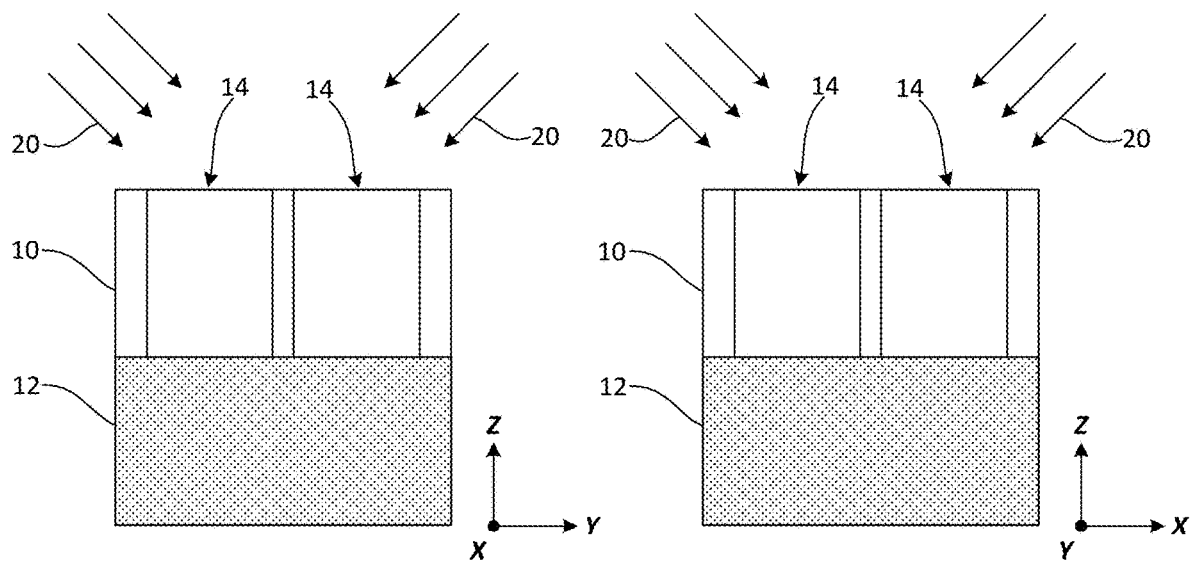
Fig. 3B
(A-A from Fig. 3A)
Fig. 3C
(B-B from Fig. 3A)

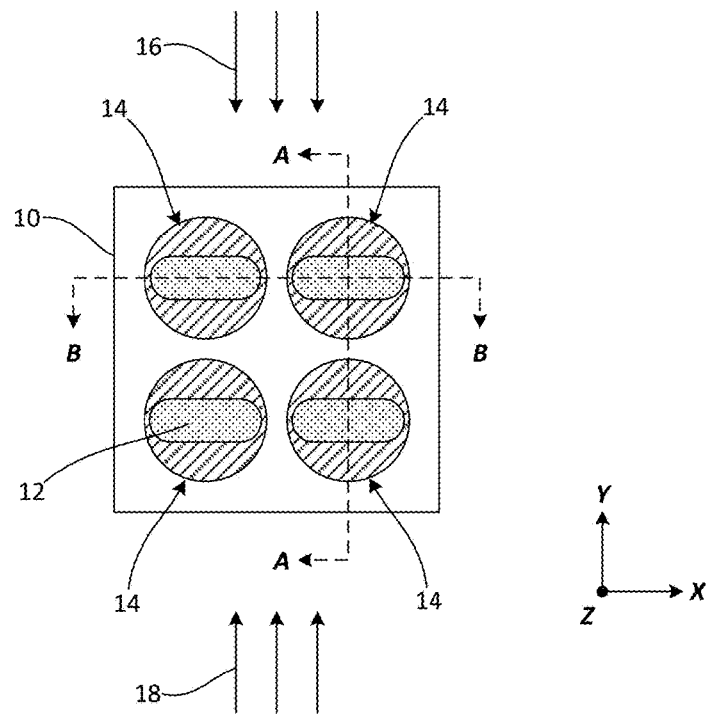
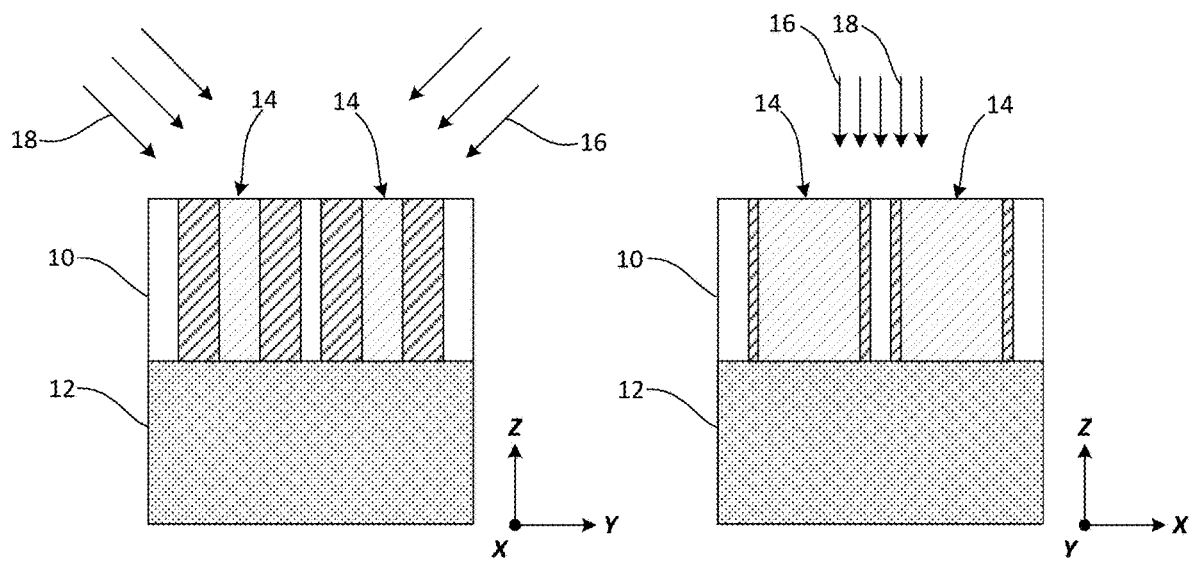
Fig. 4A
Fig. 4B
(A-A from Fig. 4A)
Fig. 4C
(B-B from Fig. 4A)

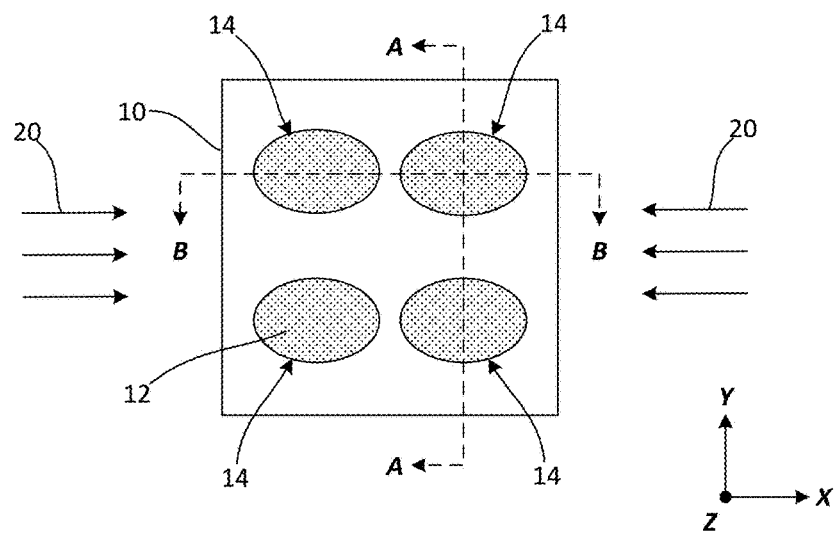
*Fig. 5A*
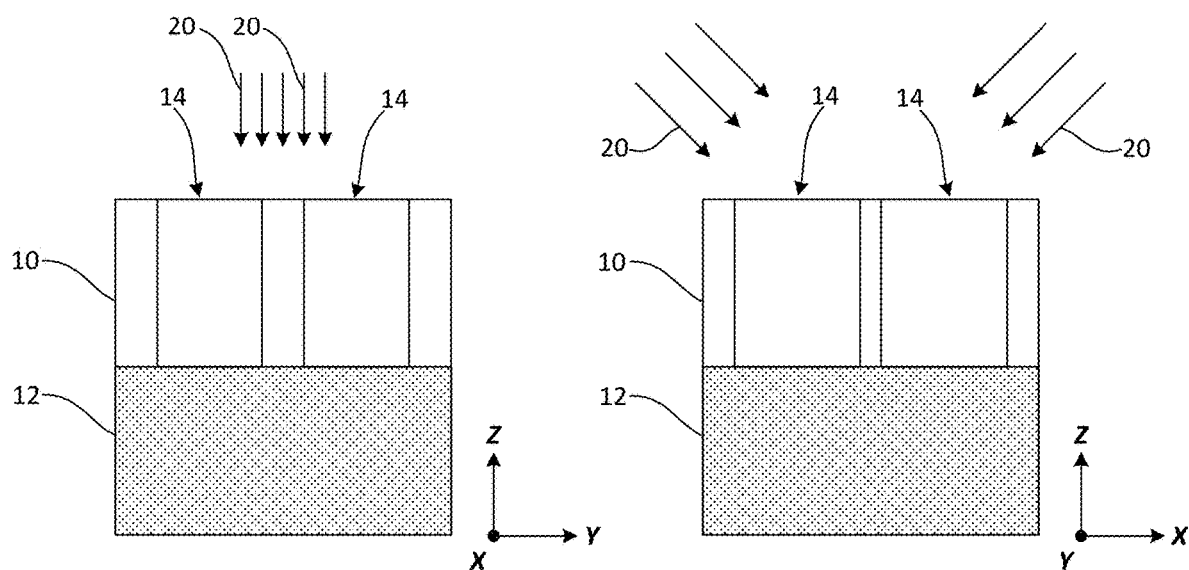
*Fig. 5B*
*(A-A from Fig. 5A)*
*Fig. 5C*
*(B-B from Fig. 5A)*

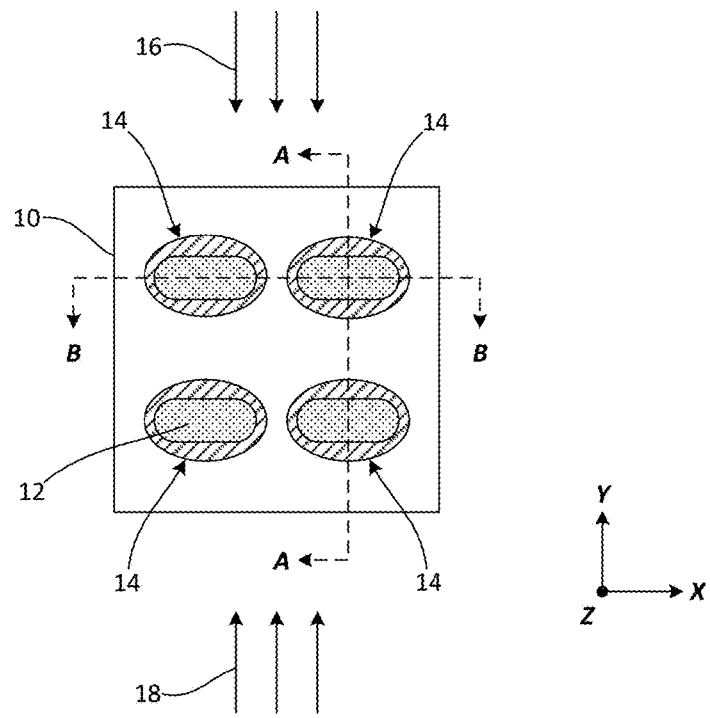
*Fig. 6A*
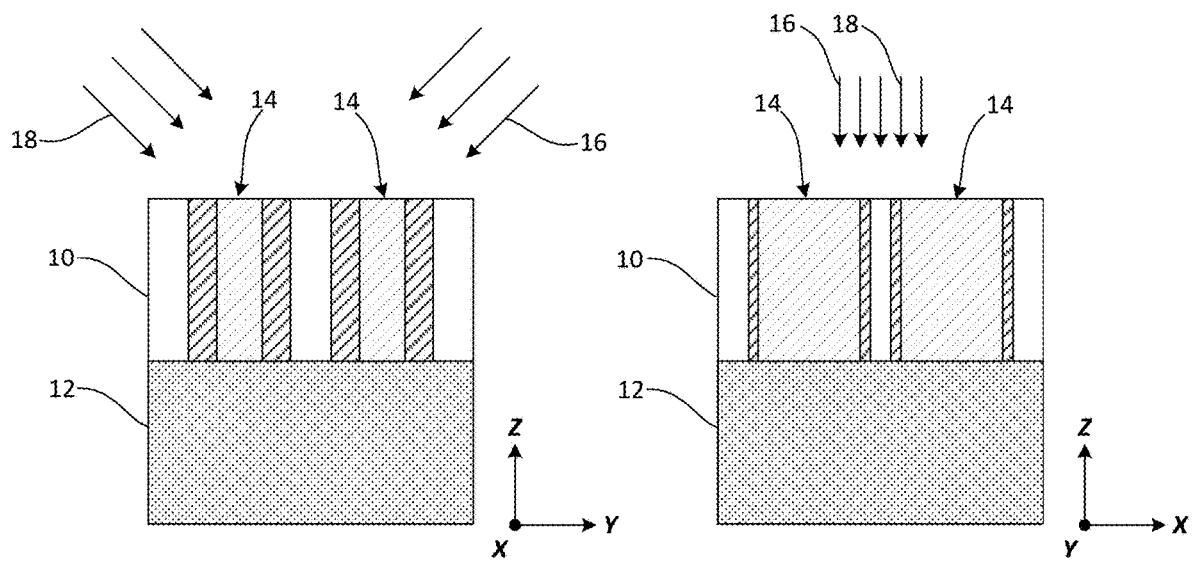
*Fig. 6B*
*(A-A from Fig. 6A)*
*Fig. 6C*
*(B-B from Fig. 6A)*

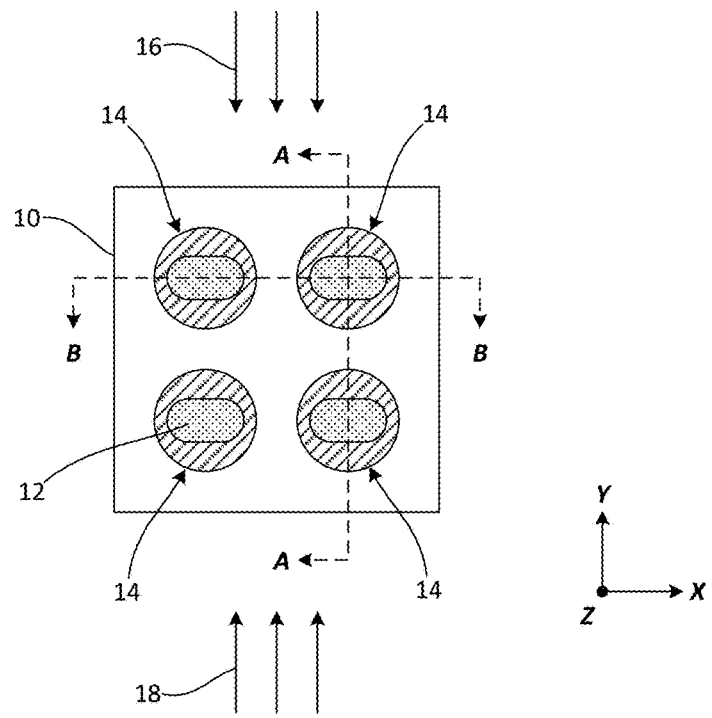
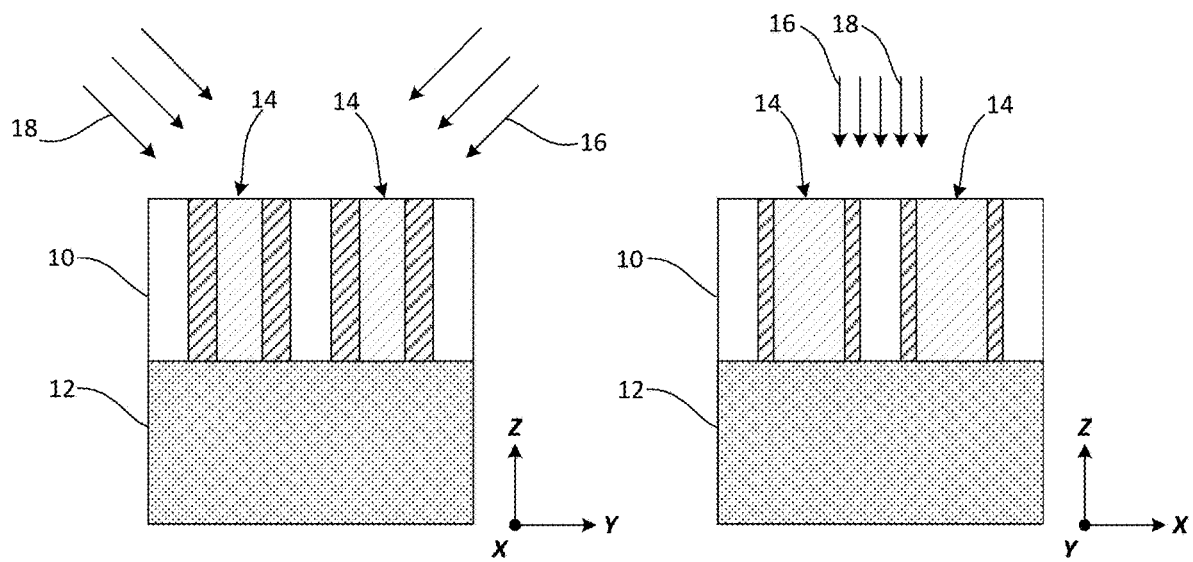
Fig. 7A
Fig. 7B
(A-A from Fig. 7A)
Fig. 7C
(B-B from Fig. 7A)

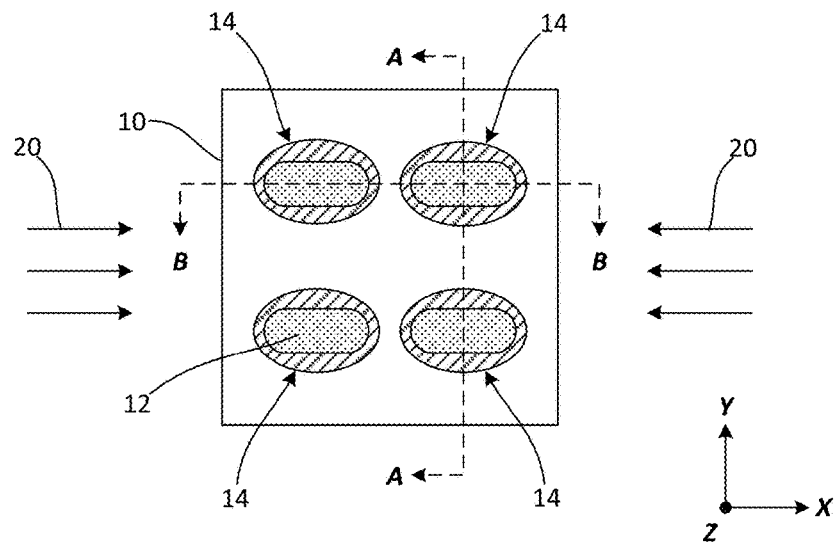
Fig. 8A
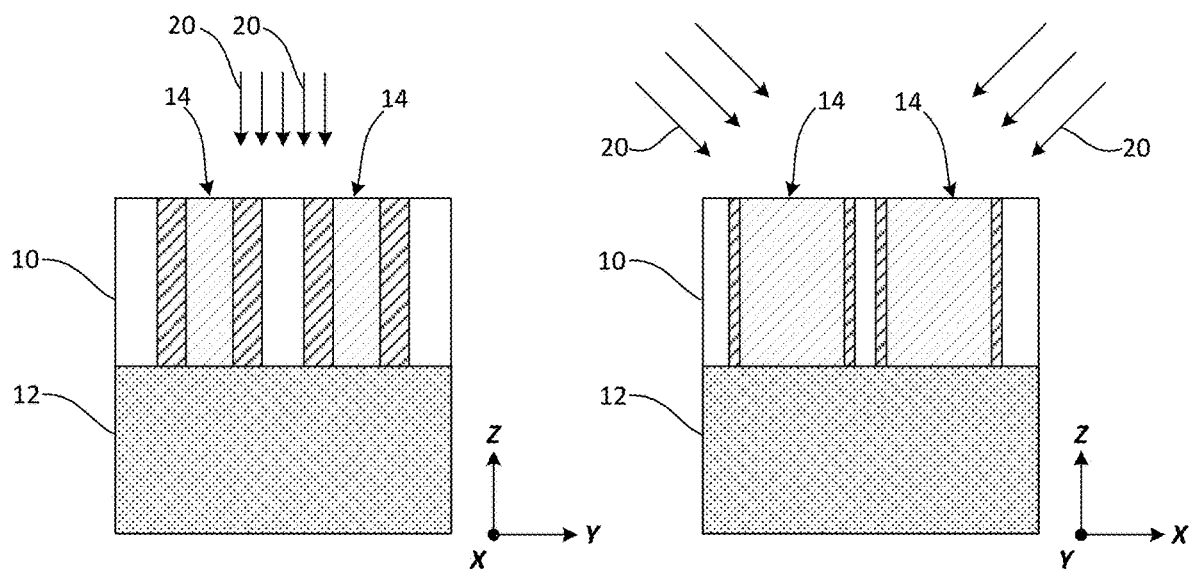
Fig. 8B
(A-A from Fig. 8A)
Fig. 8C
(B-B from Fig. 8A)

METHODS OF MODIFYING OPENINGS IN HARDMASKS AND PHOTORESISTS TO ACHIEVE DESIRED CRITICAL DIMENSIONS

FIELD OF THE DISCLOSURE

Embodiments of the present disclosure relate generally to the field of semiconductor device fabrication, and more particularly to methods for modifying the size and shape of openings in hardmasks and photoresists to achieve desired critical dimensions.

BACKGROUND OF THE DISCLOSURE

Semiconductor device fabrication employs many discrete processes to create desired features in a semiconductor substrate. Some of these processes include lithography, etching, deposition, and ion implantation. In the case of etching, a layer of material, referred to as a hardmask or photoresist, is disposed on the surface of a semiconductor substrate to be etched. Openings in the hardmask expose the underlying substrate. An ion beam formed of reactive plasma ions is directed at the hardmask, and the exposed portions of the underlying substrate are etched by the ion beam to create desired features (e.g., trenches) therein while other portions of the substrate are shielded from the ion beam by the hardmask.

As semiconductor devices continue to scale to smaller dimensions, the patterning of surface features in semiconductor substrates becomes increasingly difficult due to manufacturing constraints. For example, it is difficult to manufacture hardmasks having openings with precise, nanometer-scale critical dimensions (e.g., openings measuring 10 nanometers×20 nanometers) with low variability. Openings having critical dimensions that deviate from desired values can detrimentally affect the performance and reliability of a completed semiconductor device.

With respect to these and other considerations, the present improvements may be useful.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

A method of modifying an opening in a mask to achieve desired critical dimensions according to an embodiment of the present disclosure may include directing a first radical beam at a first lateral side of the opening to deposit a layer of material on the first lateral side, and directing a second radical beam at a second lateral side of the opening opposite the first lateral side to deposit a layer of material on the second lateral side.

Another method of modifying an opening in a mask to achieve desired critical dimensions according to an embodiment of the present disclosure may include performing a pre-implant on the mask to implant the mask with a dopant material, wherein a material of the mask is densified and the opening is enlarged, directing a first radical beam at a first lateral side of the opening to deposit a layer of material on the first lateral side, and directing a second radical beam at a second lateral side of the opening opposite the first lateral side to deposit a layer of material on the second lateral side.

Another method of modifying an opening in a mask to achieve desired critical dimensions according to an embodiment of the present disclosure may include directing a first radical beam at a first lateral side of the opening to deposit a layer of material on the first lateral side, directing a second radical beam at a second lateral side of the opening opposite the first lateral side to deposit a layer of material on the second lateral side, and performing a post-implant on the mask, the post-implant including directing a first ion beam at the mask in a first direction to implant the mask with a dopant material, and directing a second ion beam at the mask in a second direction opposite the first direction to implant the mask with a dopant material, wherein a material of the mask is densified and the opening is enlarged in the first direction and the in the second direction.

BRIEF DESCRIPTION OF THE DRAWINGS

By way of example, various embodiments of the disclosed techniques will now be described, with reference to the accompanying drawings, wherein:

FIGS. 1A-1C are a top view, a first cross-sectional view, and a second cross-sectional view illustrating a semiconductor substrate and a mask in accordance with the present disclosure;

FIGS. 2A-2C are a top view, a first cross-sectional view, and a second cross-sectional view illustrating a first method in accordance with an embodiment of the present disclosure;

FIGS. 3A-3C are a top view, a first cross-sectional view, and a second cross-sectional view illustrating a first step of a second method in accordance with an embodiment of the present disclosure;

FIGS. 4A-4C are a top view, a first cross-sectional view, and a second cross-sectional view illustrating a second step of the second method in accordance with an embodiment of the present disclosure;

FIGS. 5A-5C are a top view, a first cross-sectional view, and a second cross-sectional view illustrating a first step of a third method in accordance with an embodiment of the present disclosure;

FIGS. 6A-6C are a top view, a first cross-sectional view, and a second cross-sectional view illustrating a second step of the third method in accordance with an embodiment of the present disclosure;

FIGS. 7A-7C are a top view, a first cross-sectional view, and a second cross-sectional view illustrating a first step of a fourth method in accordance with an embodiment of the present disclosure;

FIGS. 8A-8C are a top view, a first cross-sectional view, and a second cross-sectional view illustrating a second step of the fourth method in accordance with an embodiment of the present disclosure.

DETAILED DESCRIPTION

The present embodiments will now be described more fully hereinafter with reference to the accompanying drawings, wherein some embodiments are shown. The subject matter of the present disclosure may be embodied in many different forms and is not to be construed as limited to the embodiments set forth herein. These embodiments are provided so this disclosure will be thorough and complete, and will convey certain exemplary aspects of the subject matter to those skilled in the art. In the drawings, like numbers refer to like elements throughout.

Referring to FIG. 1A, a top view illustrating a hardmask or photoresist 10 (hereinafter generically referred to as "the mask 10") disposed atop a semiconductor substrate 12 is shown. FIGS. 1B and 1C illustrate cross-sectional views taken along lines A-A and B-B in FIG. 1A, respectively. The mask 10 may have openings 14 formed therein to expose the underlying substrate 12 (i.e., when viewed from above). During an etching process, an ion beam formed of reactive plasma ions may be directed at the mask 10 from above. The exposed portions of the underlying substrate 12 (i.e., the portions of the substrate 12 directly below the openings 14) are etched by the ion beam to create desired features (e.g., trenches) therein, while other portions of the substrate 12 are shielded from the ion beam by the mask 10.

In various embodiments, the mask 10 may be formed of silicon dioxide or silicon carbide. The present disclosure is not limited in this regard, and the mask 10 may alternatively be formed of other hardmask or photoresist materials known to those of ordinary skill in the art.

When the mask 10 is manufactured, the openings 14 in the mask 10 are ideally formed with a desired shape having desired dimensions, often referred to as "critical dimensions" (CDs), for transferring a desired etch pattern to a substrate. However, due to manufacturing constraints, it can be difficult or impossible to produce masks with openings having certain shapes with nanometer-scale dimensions with reliability and precision ("nanometer-scale" shall be defined herein to mean less than 1000 nanometers). For example, forming slots measuring 10 nanometers wide by 20 nanometers long has been found to be challenging. "Width" shall be defined herein to mean a dimension measured in a direction parallel to the Y axis of the Cartesian coordinate system illustrated in FIG. 1A, and "length" shall be defined herein to mean a dimension measured in a direction parallel to the X axis of the Cartesian coordinate system illustrated in FIG. 1A. The aforementioned dimensions are not intended to be limiting and are provided by way of example only.

The embodiments of the present disclosure seek to address the challenges associated with producing openings having precise, nanometer-scale dimensions by using directional deposition and implantation processes to modify openings formed using traditional manufacturing processes.

Method 1: Directional Deposition

In a first method of the present disclosure, a mask 10 and an underlying substrate 12 are provided as shown in FIG. 1A. The mask 10 may have round openings formed using traditional manufacturing techniques, including, and not limited to, extreme ultraviolet (EUV) lithography. In a non-limiting example, the openings 14 may have diameters of 20 nanometers.

Referring to FIGS. 2A-2C, a directional deposition process may be performed, wherein a first radical beam 16 emitted from a plasma enhanced chemical vapor deposition (PECVD) source (not shown) may be projected onto the mask 10 in a first direction parallel to the Y axis of the Cartesian coordinate system illustrated in FIG. 2A, and a second radical beam 16 emitted from a PECVD source (not shown) may be projected onto the mask 10 in a second direction parallel to the Y axis of the Cartesian coordinate system illustrated in FIG. 2A, wherein the second direction is opposite the first direction. In various embodiments, the deposited material may be carbon. The present disclosure is not limited in this regard.

The first and second radical beams 16, 18 may be emitted from two separate PECVD sources, or they may be sequentially emitted from one PECVD source, wherein the mask 10 and/or the PECVD source may be repositioned between the first deposition and the second deposition to achieve depositions on opposing portions of the mask 10. For example, the mask 10 may be rotated 180 degrees about a central axis parallel to the Z axis of the Cartesian coordinate system illustrated in FIG. 2B between the first deposition and the second deposition. The first and second radical beams 16, 18 may be directed at the mask 10 at an angle in a range of 30 degrees to 60 degrees (e.g., 45 degrees) relative to the Y axis of the Cartesian coordinate system illustrated in FIG. 2B (i.e., relative to a top surface of the mask 10) to deposit a layer of material having a generally uniform thickness from a top of the openings 14 furthest from the substrate 12 to a bottom of the openings nearest the substrate 12. The present disclosure is not limited in this regard.

While it is understood that a round opening does not have multiple sides, and for purposes of description herein, the portions of the openings 14 nearest the top and bottom of the page as viewed in FIG. 2A shall be referred to herein as the "lateral sides" of the openings 14, and portions of the openings 14 nearest the left and right of the page as viewed in FIG. 2A shall be referred to herein as the "longitudinal sides" of the openings 14. Thus, the first and second radical beams 16, 18 may be said to be directed at opposing lateral sides of the openings 14. As shown in FIGS. 2A-2C, a majority of the material deposited by the first and second radical beams 16, 18 may be deposited on the opposing lateral sides of the openings onto which the first and second radical beams 16, 18 are projected. Thus, the widths of the openings 14 may be reduced from 20 nanometers to a desired width of approximately 10 nanometers (for example), thus converting the openings 14 from holes to slots ("slot" is defined herein to mean an opening having a length greater than its width) as best shown in FIG. 2A. However, since the openings 14 are round, and since radical beams are prone to a certain amount of spread, some material will also be deposited on the longitudinal sides of the openings 14. Of course, the amount of material deposited on the longitudinal sides of the openings 14 will be less than the amount of material deposited on the lateral sides of the openings 14, and a slot shape may still be achieved.

After the above-described deposition processes are performed, an etching process may be performed, wherein an ion beam formed of reactive plasma ions may be directed at the mask 10 from above. The exposed portions of the underlying substrate 12 (i.e., the portions of the substrate 12 directly below the openings 14) may be etched by the ion beam to create slots therein, while other portions of the substrate 12 are shielded from the ion beam by the mask 10.

Method 2: Pre-Implant+Directional Deposition

In a second method of the present disclosure, a mask 10 and underlying substrate 12 are provided as shown in FIG. 1A. The mask 10 may have round openings formed using traditional manufacturing techniques, including, and not limited to, EUV lithography. In a non-limiting example, the openings 14 may have diameters of 20 nanometers.

Referring to FIGS. 3A-3C, an implantation process (a "pre-implant") may be performed, wherein one or more ion beams 20 emitted from one or more ion sources (not shown) may be projected onto the mask 10 to implant the mask 10 with a dopant material. In various embodiments, the dopant material may be argon, carbon, or another material selected to densify the mask 10 as further described below. The mask 10 and/or the ion source(s) may be scanned, tilted, rotated, or otherwise repositioned during the implantation process to achieve uniform implantation of the mask 10. For example, the mask 10 may be rotated 180 degrees about a central axis parallel to the Z axis of the Cartesian coordinate system illustrated in FIG. 3A. The ion beams 20 may be directed at the mask 10 at an angle in a range of 30 degrees to 60 degrees (e.g., 45 degrees) relative to the Y and X axes of the Cartesian coordinate systems illustrated in FIGS. 3B and 3C (i.e., relative to a top surface of the mask 10). The present disclosure is not limited in this regard.

The above-described implantation process may densify the material of the mask 10, causing the portions of the mask 10 between the openings 14 to shrink and the causing the openings 14 themselves to be enlarged. For example, the openings 14 may be enlarged from a first diameter of 20 nanometers shown in FIGS. 1A-1C to a second diameter of about 25 nanometers shown in FIGS. 3A-3B. The present disclosure is not limited in this regard.

Referring to FIGS. 4A-4C, a directional deposition process may be performed on the densified mask 10, wherein a first radical beam 16 emitted from a PECVD source (not shown) may be projected onto the mask 10 in a first direction parallel to the Y axis of the Cartesian coordinate system illustrated in FIG. 4A, and a second radical beam 16 emitted from a PECVD source (not shown) may be projected onto the mask 10 in a second direction parallel to the Y axis of the Cartesian coordinate system illustrated in FIG. 4A, wherein the second direction is opposite the first direction. In various embodiments, the deposited material may be carbon. The present disclosure is not limited in this regard.

The first and second radical beams 16, 18 may be emitted from two separate PECVD sources, or they may be sequentially emitted from one PECVD source, wherein the mask 10 and/or the PECVD source may be repositioned between the first deposition and the second deposition to achieve depositions on opposing portions of the mask 10. For example, the mask 10 may be rotated 180 degrees about a central axis parallel to the Z axis of the Cartesian coordinate system illustrated in FIG. 4B between the he first deposition and the second deposition. The first and second radical beams 16, 18 may be directed at the mask 10 at an angle in a range of 30 degrees to 60 degrees (e.g., 45 degrees) relative to the Y axis of the Cartesian coordinate system illustrated in FIG. 4B (i.e., relative to a top surface of the mask 10) to deposit a layer of material having a generally uniform thickness from a top of the openings 14 furthest from the substrate 12 to a bottom of the openings nearest the substrate 12. The present disclosure is not limited in this regard.

While it is understood that a round opening does not have multiple sides, and for purposes of description herein, the portions of the openings 14 nearest the top and bottom of the page as viewed in FIG. 4A shall be referred to herein as the "lateral sides" of the openings 14, and portions of the openings 14 nearest the left and right of the page as viewed in FIG. 4A shall be referred to herein as the "longitudinal sides" of the openings 14. Thus, the first and second radical beams 16, 18 may be said to be directed at opposing lateral sides of the openings 14. As shown in FIGS. 4A-4C, a majority of the material deposited by the first and second radical beams 16, 18 may be deposited on the opposing lateral sides of the openings onto which the first and second radical beams 16, 18 are projected. Thus, the widths of the openings 14 may be reduced from 20 nanometers to a desired width of approximately 10 nanometers (for example), thus converting the openings 14 from holes to slots as best shown in FIG. 4A. However, since the openings 14 are round, and since radical beams are prone to a certain amount of spread, some material will also be deposited on the longitudinal sides of the openings 14. Of course, the amount of material deposited on the longitudinal sides of the openings 14 will be less than the amount of material deposited on the lateral sides of the openings 14, and a slot shape may still be achieved.

Additionally, since the openings 14 were previously enlarged by the above-described implantation process, the material deposited on the longitudinal sides of the openings 14 may shrink the openings back to (or near) a length of 20 nanometers (i.e., the original "length" of the openings provided in FIGS. 1A-1C), thus producing slots with desired dimensions of 20 nanometers long by 10 nanometers wide. This is to be contrasted with Method 1 described above, wherein the lengths of the openings 14 were reduced to a value below the desired length of 20 nanometers due to deposition on the longitudinal sides of the openings 14.

After the above-described implantation and deposition processes are performed, an etching process may be performed, wherein an ion beam formed of reactive plasma ions may be directed at the mask 10 from above. The exposed portions of the underlying substrate 12 (i.e., the portions of the substrate 12 directly below the openings 14) may be etched by the ion beam to create slots therein, while other portions of the substrate 12 are shielded from the ion beam by the mask 10.

Method 3: Directional Pre-Implant+Directional Deposition

In a third method of the present disclosure, a mask 10 and underlying substrate 12 are provided as shown in FIG. 1A. The mask 10 may have round openings formed using traditional manufacturing techniques, including, and not limited to, EUV lithography. In a non-limiting example, the openings 14 may have diameters of 20 nanometers.

Referring to FIGS. 5A-5C, a directional implantation process (a "directional pre-implant") may be performed, wherein one or more ion beams 20 emitted from one or more ion sources (not shown) may be projected onto the mask 10 in a direction (or in two opposing directions) parallel to the X axis of the Cartesian coordinate system illustrated in FIG. 5A to implant the mask 10 with a dopant material. In various embodiments, the dopant material may be argon, carbon, or another material selected to densify the mask 10 as further described below. The mask 10 and/or the ion source(s) may be scanned, tilted, rotated, or otherwise repositioned during the implantation process to achieve implantation in a direction (or in two opposing directions) parallel to the X axis of the Cartesian coordinate system. For example, the mask 10 may be rotated 180 degrees about a central axis parallel to the Z axis of the Cartesian coordinate system illustrated in FIG. 5A. The ion beams 20 may be directed at the mask 10 at an angle in a range of 30 degrees to 60 degrees (e.g., 45 degrees) relative to the X axis of the Cartesian coordinate system illustrated in FIG. 5C (i.e., relative to a top surface of the mask 10). The present disclosure is not limited in this regard.

The above-described implantation process may densify the material of the mask 10 in a direction parallel to the X axis of the Cartesian coordinate system, causing portions of the mask 10 between the openings 14 to shrink in a direction parallel to the X axis of the Cartesian coordinate system and the causing the openings 14 themselves to be enlarged in a direction parallel to the X axis of the Cartesian coordinate system. Notably, and unlike the embodiment of Method 2 described above, the ion beams 20 are not projected onto the mask 10 in a direction parallel to the Y axis of the Cartesian coordinate system, and thus the openings are not enlarged in a direction parallel to the Y axis of the Cartesian coordinate system (i.e., the openings 14 are lengthened but not widened). For example, the openings 14 may be enlarged from a first length of 20 nanometers shown in FIGS. 1A-1C to a second length of 25 nanometers shown in FIGS. 5A-5B, whereas the original widths of the openings 14 are preserved. The present disclosure is not limited in this regard.

Referring to FIGS. 6A-6C, a directional deposition process may be performed on the densified mask 10, wherein a first radical beam 16 emitted from a PECVD source (not shown) may be projected onto the mask 10 in a first direction parallel to the Y axis of the Cartesian coordinate system illustrated in FIG. 6A, and a second radical beam 16 emitted from a PECVD source (not shown) may be projected onto the mask 10 in a second direction parallel to the Y axis of the Cartesian coordinate system illustrated in FIG. 6A, wherein the second direction is opposite the first direction. In various embodiments, the deposited material may be carbon. The present disclosure is not limited in this regard.

The first and second radical beams 16, 18 may be emitted from two separate PECVD sources, or they may be sequentially emitted from one PECVD source, wherein the mask 10 and/or the PECVD source may be repositioned between the first deposition and the second deposition to achieve depositions on opposing portions of the mask 10. For example, the mask 10 may be rotated 180 degrees about a central axis parallel to the Z axis of the Cartesian coordinate system illustrated in FIG. 6B between the he first deposition and the second deposition. The first and second radical beams 16, 18 may be directed at the mask 10 at an angle in a range of 30 degrees to 60 degrees (e.g., 45 degrees) relative to the Y axis of the Cartesian coordinate system illustrated in FIG. 6B (i.e., relative to a top surface of the mask 10) to deposit a layer of material having a generally uniform thickness from a top of the openings 14 furthest from the substrate 12 to a bottom of the openings nearest the substrate 12. The present disclosure is not limited in this regard.

While it is understood that a round opening does not have multiple sides, and for purposes of description herein, the portions of the openings 14 nearest the top and bottom of the page as viewed in FIG. 6A shall be referred to herein as the "lateral sides" of the openings 14, and portions of the openings 14 nearest the left and right of the page as viewed in FIG. 6A shall be referred to herein as the "longitudinal sides" of the openings 14. Thus, the first and second radical beams 16, 18 may be said to be directed at opposing lateral sides of the openings 14. As shown in FIGS. 6A-6C, most or all of the material deposited by the first and second radical beams 16, 18 may be deposited on the opposing lateral sides of the openings onto which the first and second radical beams 16, 18 are projected. Thus, the widths of the openings 14 may be reduced from 20 nanometers to a desired width of approximately 10 nanometers (for example), thus converting the openings 14 from holes to slots as best shown in FIG. 6A. However, since the openings 14 are round, and since radical beams are prone to a certain amount of spread, some material may also be deposited on the longitudinal sides of the openings 14. Of course, the amount of material deposited on the longitudinal sides of the openings 14, if any, will be less than the amount of material deposited on the lateral sides of the openings 14, and a slot shape may still be achieved.

Since the openings 14 were not initially widened (i.e., enlarged in a direction parallel to the Y axis of the Cartesian coordinate system) in the manner of Method 2 described above, the amount of deposition necessary to reduce the widths of the openings 14 to a desired value (e.g., 10 nanometers) is reduced relative to Method 2. Thus, the amount of collateral deposition on the longitudinal sides of the openings 14 is also reduced relative to Method 2, meaning that the openings 14 can be initially lengthened to a lesser extent than in Method 2 to achieve slots having the same desired dimensions (e.g., 20 nanometers long by 10 nanometers wide).

After the above-described implantation and deposition processes are performed, an etching process may be performed, wherein an ion beam formed of reactive plasma ions may be directed at the mask 10 from above. The exposed portions of the underlying substrate 12 (i.e., the portions of the substrate 12 directly below the openings 14) may be etched by the ion beam to create slots therein, while other portions of the substrate 12 are shielded from the ion beam by the mask 10.

Method 4: Directional Deposition+Directional Post-Implant

In a fourth method of the present disclosure, a mask 10 and underlying substrate 12 are provided as shown in FIG. 1A. The mask 10 may have round openings formed using traditional manufacturing techniques, including, and not limited to, EUV lithography. In a non-limiting example, the openings 14 may have diameters of 20 nanometers.

Referring to FIGS. 7A-7C, and similar to Method 1 described above, a directional deposition process may be performed, wherein a first radical beam 16 emitted from a plasma enhanced chemical vapor deposition (PECVD) source (not shown) may be projected onto the mask 10 in a first direction parallel to the Y axis of the Cartesian coordinate system illustrated in FIG. 7A, and a second radical beam 16 emitted from a PECVD source (not shown) may be projected onto the mask 10 in a second direction parallel to the Y axis of the Cartesian coordinate system illustrated in FIG. 7A, wherein the second direction is opposite the first direction. In various embodiments, the deposited material may be carbon. The present disclosure is not limited in this regard.

The first and second radical beams 16, 18 may be emitted from two separate PECVD sources, or they may be sequentially emitted from one PECVD source, wherein the mask 10 and/or the PECVD source may be repositioned between the first deposition and the second deposition to achieve depositions on opposing portions of the mask 10. For example, the mask 10 may be rotated 180 degrees about a central axis parallel to the Z axis of the Cartesian coordinate system illustrated in FIG. 7B between the he first deposition and the second deposition. The first and second radical beams 16, 18 may be directed at the mask 10 at an angle in a range of 30 degrees to 60 degrees (e.g., 45 degrees) relative to the Y axis of the Cartesian coordinate system illustrated in FIG. 7B (i.e., relative to a top surface of the mask 10) to deposit a layer of material having a generally uniform thickness from a top of the openings 14 furthest from the substrate 12 to a bottom of the openings nearest the substrate 12. The present disclosure is not limited in this regard.

While it is understood that a round opening does not have multiple sides, and for purposes of description herein, the portions of the openings 14 nearest the top and bottom of the page as viewed in FIG. 7A shall be referred to herein as the "lateral sides" of the openings 14, and portions of the openings 14 nearest the left and right of the page as viewed in FIG. 7A shall be referred to herein as the "longitudinal sides" of the openings 14. Thus, the first and second radical beams 16, 18 may be said to be directed at opposing lateral sides of the openings 14. As shown in FIGS. 7A-7C, a majority of the material deposited by the first and second radical beams 16, 18 may be deposited on the opposing lateral sides of the openings onto which the first and second radical beams 16, 18 are projected. Thus, the widths of the openings 14 may be reduced from 20 nanometers to a desired width of approximately 10 nanometers (for example), thus converting the openings 14 from holes to slots ("slot" is defined herein to mean an opening having a length greater than its width) as best shown in FIG. 7A. However, since the openings 14 are round, and since radical beams are prone to a certain amount of spread, some material will also be deposited on the longitudinal sides of the openings 14. Of course, the amount of material deposited on the longitudinal sides of the openings 14 will be less than the amount of material deposited on the lateral sides of the openings 14, and a slot shape may still be achieved. Nonetheless, the deposition on the longitudinal sides of the openings 14 may reduce the lengths of the openings below a desired value. For example, the lengths of the openings 14 may be reduced from a desired value of 20 nanometers to about 15 nanometers.

To achieve slots with a desired length (e.g., 20 nanometers), and referring to FIGS. 8A-8C, a directional implantation process (a "directional post-implant") may be performed, wherein one or more ion beams 20 emitted from one or more ion sources (not shown) may be projected onto the mask 10 in a direction (or in two opposing directions) parallel to the X axis of the Cartesian coordinate system illustrated in FIG. 8A to implant the mask 10 with a dopant material. In various embodiments, the dopant material may be argon, carbon, or another material selected to densify the mask 10 as further described below. The mask 10 and/or the ion source(s) may be scanned, tilted, rotated, or otherwise repositioned during the implantation process to achieve implantation in a direction (or in two opposing directions) parallel to the X axis of the Cartesian coordinate system. For example, the mask 10 may be rotated 180 degrees about a central axis parallel to the Z axis of the Cartesian coordinate system illustrated in FIG. 8A. The ion beams 20 may be directed at the mask 10 at an angle in a range of 30 degrees to 60 degrees (e.g., 45 degrees) relative to the X axis of the Cartesian coordinate system illustrated in FIG. 8C (i.e., relative to a top surface of the mask 10). The present disclosure is not limited in this regard.

The above-described implantation process may densify the material of the mask 10 in a direction parallel to the X axis of the Cartesian coordinate system, causing portions of the mask 10 between the openings 14 to shrink in a direction parallel to the X axis of the Cartesian coordinate system and the causing the openings 14 themselves to be enlarged in a direction parallel to the X axis of the Cartesian coordinate system. Notably, and unlike the embodiment of Method 2 described above, the ion beams 20 are not projected onto the mask 10 in a direction parallel to the Y axis of the Cartesian coordinate system, and thus the openings are not enlarged in a direction parallel to the Y axis of the Cartesian coordinate system (i.e., the openings 14 are lengthened but not widened). Thus, in the directional deposition process of FIGS. 7A-7B, the openings 14 were shortened from a first length of 20 nanometers to a second length of about 15 nanometers, and in the directional implantation process of FIGS. 8A-8B the openings may be lengthened to a third length of about 20 nanometers (i.e., the desired length) while preserving the desired width (e.g., 10 nanometers).

After the above-described deposition and implantation processes are performed, an etching process may be performed, wherein an ion beam formed of reactive plasma ions may be directed at the mask 10 from above. The exposed portions of the underlying substrate 12 (i.e., the portions of the substrate 12 directly below the openings 14) may be etched by the ion beam to create slots therein, while other portions of the substrate 12 are shielded from the ion beam by the mask 10.

Method 5: Directional Pre-Implant+Directional Deposition+Directional Post-Implant A further embodiment of the present disclosure is contemplated wherein a hybrid of above-described Methods 3 and 4 may be implemented. Specifically, such an embodiment may include performing a direction pre-implant (as described above in Method 3 and as shown in FIGS. 5A-5C), followed by performing a directional deposition process (as described above in Method 3 and as shown in FIGS. 6A-6C), followed by performing a directional post-implant (as described above in Method 4 and as shown in FIGS. 8A-5C). Such a hybrid method may be appropriate in situations where, after performing the pre-implant and deposition processes of Method 3, there is excessive collateral deposition on the longitudinal sides of the openings 14, thus producing slots with lengths shorter than a desired value (e.g., 20 nanometers). By additionally performing the post-implant of Method 4, the slots may be enlarged in a direction parallel to the X axis of the Cartesian coordinate system to achieve the desired length.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, while the present disclosure has been described herein in the context of a particular implementation in a particular environment for a particular purpose, those of ordinary skill in the art will recognize its usefulness is not limited thereto. Embodiments of the present disclosure may be beneficially implemented in any number of environments for any number of purposes. Accordingly, the claims set forth below shall be construed in view of the full breadth and spirit of the present disclosure as described herein.

The invention claimed is:

1. A method of modifying an opening in a mask to achieve critical dimensions, the method comprising:
    performing a pre-implant on the mask to implant the mask with a dopant material, wherein a material of the mask is densified and the opening is enlarged;
    directing a first radical beam at a first lateral side of the opening to deposit a layer of material on the first lateral side; and
    directing a second radical beam at a second lateral side of the opening opposite the first lateral side to deposit a layer of material on the second lateral side.

2. The method of claim 1, wherein the dopant material is selected from one of argon and carbon.

3. The method of claim 1, wherein the pre-implant is a directional pre-implant comprising:
    directing a first ion beam at the mask in a first direction to implant the mask with a dopant material; and
    directing a second ion beam at the mask in a second direction opposite the first direction to implant the mask with a dopant material;
    wherein the material of the mask is densified and the opening is enlarged in the first direction and in the second direction.

4. The method of claim 3, wherein the first ion beam is directed at the mask at an angle in a range of 30 degrees to 60 degrees relative to a top surface of the mask.

5. The method of claim 4, wherein the second ion beam is directed at the mask at an angle in a range of 30 degrees to 60 degrees relative to a top surface of the mask.

6. The method of claim 1, wherein a length of the opening is reduced by a first amount and a width of the opening is reduced by a second amount, wherein the second amount is greater than the first amount.

7. The method of claim 1, further comprising rotating the mask between directing the first radical beam at the first lateral side of the opening and directing the second radical beam at the second lateral side of the opening.

8. The method of claim 1, wherein the first radical beam and the second radical beam are directed at the first lateral side of the opening and at the second lateral side of the opening, respectively, at angles in a range of 30 degrees to 60 degrees relative to a top surface of the mask.

9. The method of claim 1, wherein the material deposited by at least one of the first radical beam and the second radical beam is carbon.

10. A method of modifying an opening in a mask to achieve critical dimensions, the method comprising:
directing a first radical beam at a first lateral side of the opening to deposit a layer of material on the first lateral side;
directing a second radical beam at a second lateral side of the opening opposite the first lateral side to deposit a layer of material on the second lateral side; and
performing a post-implant on the mask, the post-implant comprising:
directing a first ion beam at the mask in a first direction to implant the mask with a dopant material; and
directing a second ion beam at the mask in a second direction opposite the first direction to implant the mask with a dopant material;
wherein a material of the mask is densified and the opening is enlarged in the first direction and the in the second direction.

11. The method of claim 10, wherein at least one of the dopant material implanted by the first ion beam and the dopant material implanted by the second ion beam is selected from one of argon and carbon.

12. The method of claim 10, wherein the first ion beam is directed at the mask at an angle in a range of 30 degrees to 60 degrees relative to a top surface of the mask.

13. The method of claim 10, wherein the second ion beam is directed at the mask at an angle in a range of 30 degrees to 60 degrees relative to a top surface of the mask.

14. The method of claim 10, wherein a length of the opening is reduced by a first amount and a width of the opening is reduced by a second amount, wherein the second amount is greater than the first amount.

15. The method of claim 10, further comprising rotating the mask between directing the first radical beam at the first lateral side of the opening and directing the second radical beam at the second lateral side of the opening.

16. The method of claim 10, wherein the first radical beam and the second radical beam are directed at the first lateral side of the opening and at the second lateral side of the opening, respectively, at angles in a range of 30 degrees to 60 degrees relative to a top surface of the mask.

17. The method of claim 10, wherein the material deposited by at least one of the first radical beam and the second radical beam is carbon.

18. The method of claim 10, further comprising performing a pre-implant on the mask, the pre-implant comprising:
directing a first ion beam at the mask in the first direction to implant the mask with a dopant material; and
directing a second ion beam at the mask in the second direction opposite the first direction to implant the mask with a dopant material;
wherein the material of the mask is densified and the opening is enlarged in the first direction and in the second direction.

* * * * *